United States Patent
Park et al.

(10) Patent No.: US 12,225,724 B2
(45) Date of Patent: Feb. 11, 2025

(54) METHODS OF MANUFACTURING A SEMICONDUCTOR DEVICE

(71) Applicant: Samsung Electronics Co., Ltd., Suwon-si (KR)

(72) Inventors: Hwanyeol Park, Seoul (KR); Sejin Kyung, Seoul (KR); Ilwoo Kim, Yongin-si (KR); Minwoo Lee, Yongin-si (KR); Youngho Jeung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 564 days.

(21) Appl. No.: 17/505,842

(22) Filed: Oct. 20, 2021

(65) Prior Publication Data

US 2022/0344367 A1    Oct. 27, 2022

(30) Foreign Application Priority Data

Apr. 23, 2021 (KR) .......................... 10-2021-0052923

(51) Int. Cl.
*H01L 27/11582* (2017.01)
*H01L 27/11524* (2017.01)
(Continued)

(52) U.S. Cl.
CPC .............. *H10B 43/27* (2023.02); *H10B 41/27* (2023.02); *H10B 41/35* (2023.02); *H10B 43/35* (2023.02)

(58) Field of Classification Search
CPC .............. H01L 21/3114; H01L 21/0332; H01L 21/0335; H01L 21/31111; H01L 21/3081;
(Continued)

(56) References Cited

U.S. PATENT DOCUMENTS 5,731,109 A    3/1998   Hwang
8,883,576 B2   11/2014  Lee et al.
(Continued)

FOREIGN PATENT DOCUMENTS

CN    110634733 A  * 12/2019  ......... H01L 21/0332
KR    10-0208441 B1    4/1999
(Continued)

OTHER PUBLICATIONS

English Translation of Maju (Year: 2019).*
English Translation of '733 (Year: 2019).*

*Primary Examiner* — Shahed Ahmed
*Assistant Examiner* — Rhys Poniente Sheker
(74) *Attorney, Agent, or Firm* — Harness, Dickey & Pierce, P.L.C.

(57) ABSTRACT

In a method of manufacturing a semiconductor device, a first insulation layer and a first sacrificial layer are alternately and repeatedly formed on a substrate to form a mold layer. A sacrificial layer structure is formed on the mold layer to include an etch stop layer and a second sacrificial layer sequentially stacked. After forming a hard mask on the sacrificial layer structure, the sacrificial layer structure and the mold layer are etched by a dry etching process using the hard mask as an etching mask to form a channel hole exposing an upper surface of the substrate and form a recess on a sidewall of the second sacrificial layer adjacent to the channel hole. A memory channel structure is formed in the channel hole. The first sacrificial layer is replaced with a gate electrode.

20 Claims, 16 Drawing Sheets

(51) Int. Cl.
*H01L 27/11556* (2017.01)
*H01L 27/1157* (2017.01)
*H10B 41/27* (2023.01)
*H10B 41/35* (2023.01)
*H10B 43/27* (2023.01)
*H10B 43/35* (2023.01)

(58) Field of Classification Search
CPC ........... H01L 21/31116; H01L 21/0227; H01L 21/32137; H01L 21/308; H01L 21/02164; H01L 21/0214; H01L 21/02129; H01L 21/0337; H10B 43/27; H10B 41/27; H10B 43/35; H10B 43/20; H10B 43/30; H10B 43/40; H10B 41/35
See application file for complete search history.

(56) References Cited

U.S. PATENT DOCUMENTS

| | | | |
|---|---|---|---|
| 9,276,009 B2 | 3/2016 | Chen | |
| 10,115,602 B2 | 10/2018 | Jung et al. | |
| 10,410,878 B2 | 9/2019 | Sun et al. | |
| 10,515,975 B1 | 12/2019 | Tao et al. | |
| 10,522,350 B2 | 12/2019 | Kwon et al. | |
| 10,672,790 B2 | 6/2020 | Yu et al. | |
| 10,804,283 B2 | 10/2020 | He et al. | |
| 2013/0164922 A1* | 6/2013 | Cho | H01L 21/32137 438/510 |
| 2018/0330948 A1* | 11/2018 | Kwon | H10B 43/10 |
| 2019/0312056 A1* | 10/2019 | Wang | H01L 21/31144 |
| 2020/0266209 A1 | 8/2020 | Yu et al. | |
| 2020/0295040 A1* | 9/2020 | Tobioka | H01L 21/31144 |

FOREIGN PATENT DOCUMENTS

| | | | | |
|---|---|---|---|---|
| KR | 10-1857025 B1 | | 5/2013 | |
| KR | 10-2018-0012918 A | | 2/2018 | |
| KR | 10-2018-0124207 A | | 11/2018 | |
| KR | 20190025524 A | * | 3/2019 | ....... H01L 21/67109 |
| KR | 10-2019-0108387 A | | 9/2019 | |
| KR | 10-2019-0122797 A | | 10/2019 | |
| KR | 10-2020-0064145 A | | 6/2020 | |

* cited by examiner

METHODS OF MANUFACTURING A SEMICONDUCTOR DEVICE

CROSS-REFERENCE TO RELATED APPLICATIONS

This application claims priority under 35 USC § 119 to Korean Patent Application No. 10-2021-0052923, filed on Apr. 23, 2021 in the Korean Intellectual Property Office (KIPO), the contents of which are herein incorporated by reference in their entirety.

BACKGROUND

1. Field

The inventive concepts relate to semiconductor devices, and more particularly to NAND flash memory devices.

2. Description of the Related Art

As the number of stacks of memory cells disposed in a vertical direction in a semiconductor device increases, the process for forming a channel extending in the vertical direction is not easy. That is, as the thickness of a mold for forming the memory cells increases, a channel hole extending through the mold may not be formed to be straight in the vertical direction, and recesses may be formed on a sidewall of the channel hole toward the mold, which may cause leakage current.

SUMMARY

Some example embodiments provide methods of manufacturing a semiconductor device having improved characteristics.

According to an aspect of the inventive concepts, a method of manufacturing a semiconductor device includes alternately and repeatedly forming a first insulation layer and a first sacrificial layer on a substrate to form a mold layer, forming a sacrificial layer structure on the mold layer, the sacrificial layer structure including an etch stop layer and a second sacrificial layer sequentially stacked, forming a hard mask on the sacrificial layer structure, etching the sacrificial layer structure and the mold layer by a dry etching process using the hard mask as an etching mask to form a channel hole exposing an upper surface of the substrate, and form a recess on a sidewall of the second sacrificial layer, the sidewall of the second sacrificial layer being adjacent to the channel hole, forming a memory channel structure in the channel hole, and replacing the first sacrificial layer with a gate electrode.

According to an aspect of the inventive concepts, a method of manufacturing a semiconductor device includes alternately and repeatedly forming a first insulation layer and a first sacrificial layer on a substrate to form a mold layer, forming a sacrificial layer structure on the mold layer, the sacrificial layer structure including a second sacrificial layer, an etch stop layer, a third sacrificial layer, a second insulation layer and a fourth sacrificial layer sequentially stacked, forming a hard mask on the sacrificial layer structure, etching the sacrificial layer structure and the mold layer by a dry etching process using the hard mask as an etching mask to form a channel hole exposing an upper surface of the substrate, forming a memory channel structure in the channel hole, and replacing the first sacrificial layer with a gate electrode.

According to an aspect of the inventive concepts, a method of manufacturing a semiconductor device includes alternately and repeatedly forming a first insulation layer and a first sacrificial layer on a substrate to form a mold layer, forming a sacrificial layer structure on the mold layer, the sacrificial layer structure including an etch stop layer and a second insulation layer sequentially stacked, forming a hard mask on the sacrificial layer structure, etching the sacrificial layer structure and the mold layer by a dry etching process using the hard mask as an etching mask to form a channel hole exposing an upper surface of the substrate, forming a memory channel structure in the channel hole, and replacing the first sacrificial layer with a gate electrode. The sacrificial layer structure may further include a second sacrificial layer between the etch stop layer and the second insulation layer. The etch rate of the second sacrificial layer with respect to an etching gas in the dry etching process may be greater than etch rates of the etch stop layer and the second insulation layer with respect to the etching gas such that a recess is formed on a sidewall of the second sacrificial layer adjacent to the channel hole during the dry etching process.

In the method of manufacturing a semiconductor device, the sacrificial layer structure including the etch stop layer and the insulation layer on the mold layer may further include sacrificial layers having etch rates greater than those of the etch stop layer and the insulation layer. Thus, during the dry etching process for forming the channel hole through the sacrificial layer structure and the mold layer, the recess may be formed on the sidewalls of the sacrificial layers, and the positive ions and radicals generated from the etching gas may be reflected from the recess upwardly, and may be rarely reflected downwardly. Accordingly, the recess might not be formed on the sidewall of the mold layer under the sacrificial layer structure. Thus, the leakage current from the gate electrode may be reduced or prevented.

DETAILED DESCRIPTION

The above and other aspects and features of semiconductor devices and/or methods of manufacturing the semiconductor device in accordance with some example embodiments will become readily understood from detail descriptions that follow, with reference to the accompanying drawings. Hereinafter, in the specifications (and not necessarily in the claims), a direction substantially perpendicular to an upper surface of a substrate may be referred to as a first direction, and two directions substantially parallel to the upper surface of the substrate and crossing each other may be referred to as second and third directions, respectively. In some example embodiments, the second and third directions may be perpendicular with each other.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
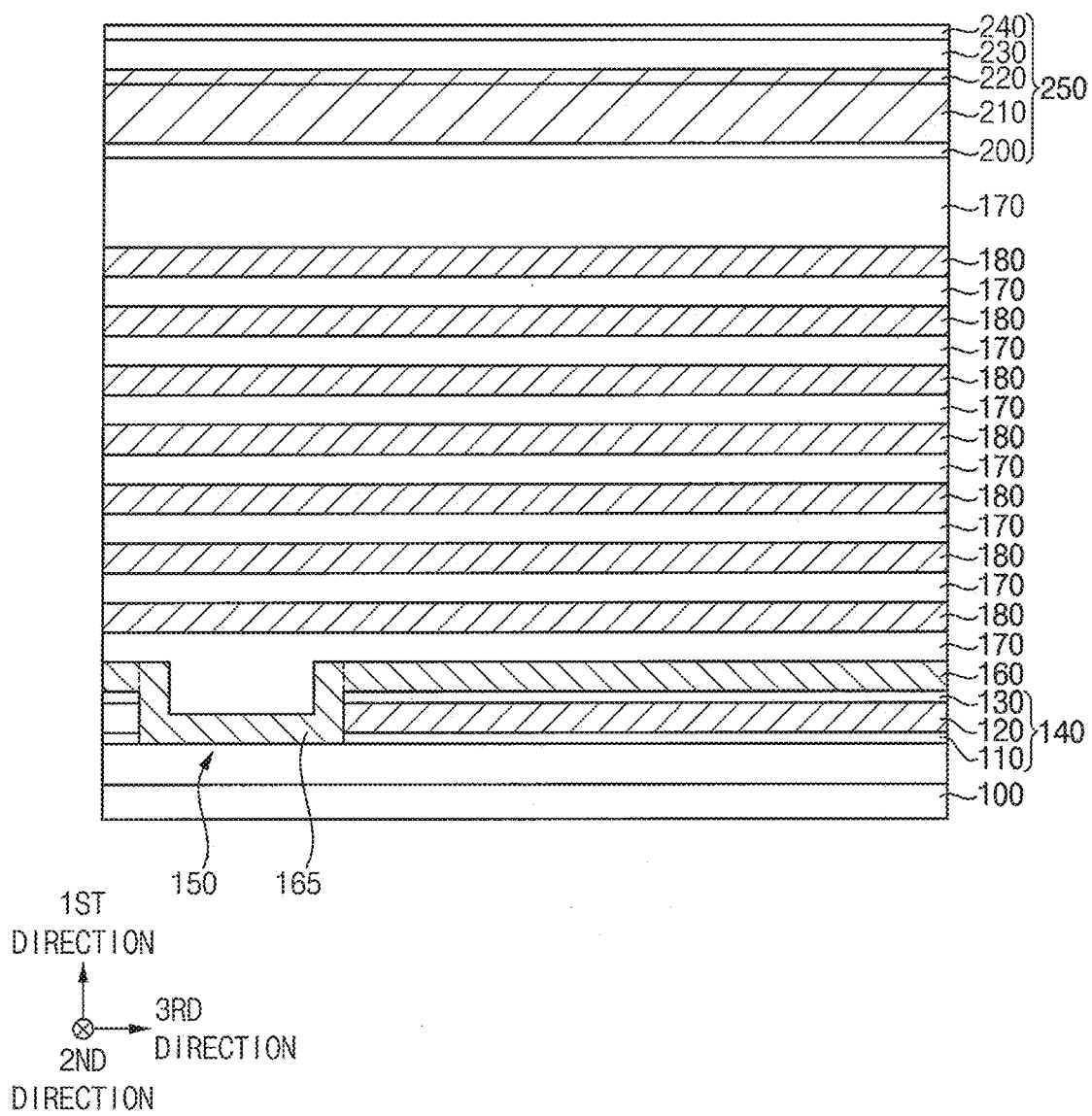
Figure 3:
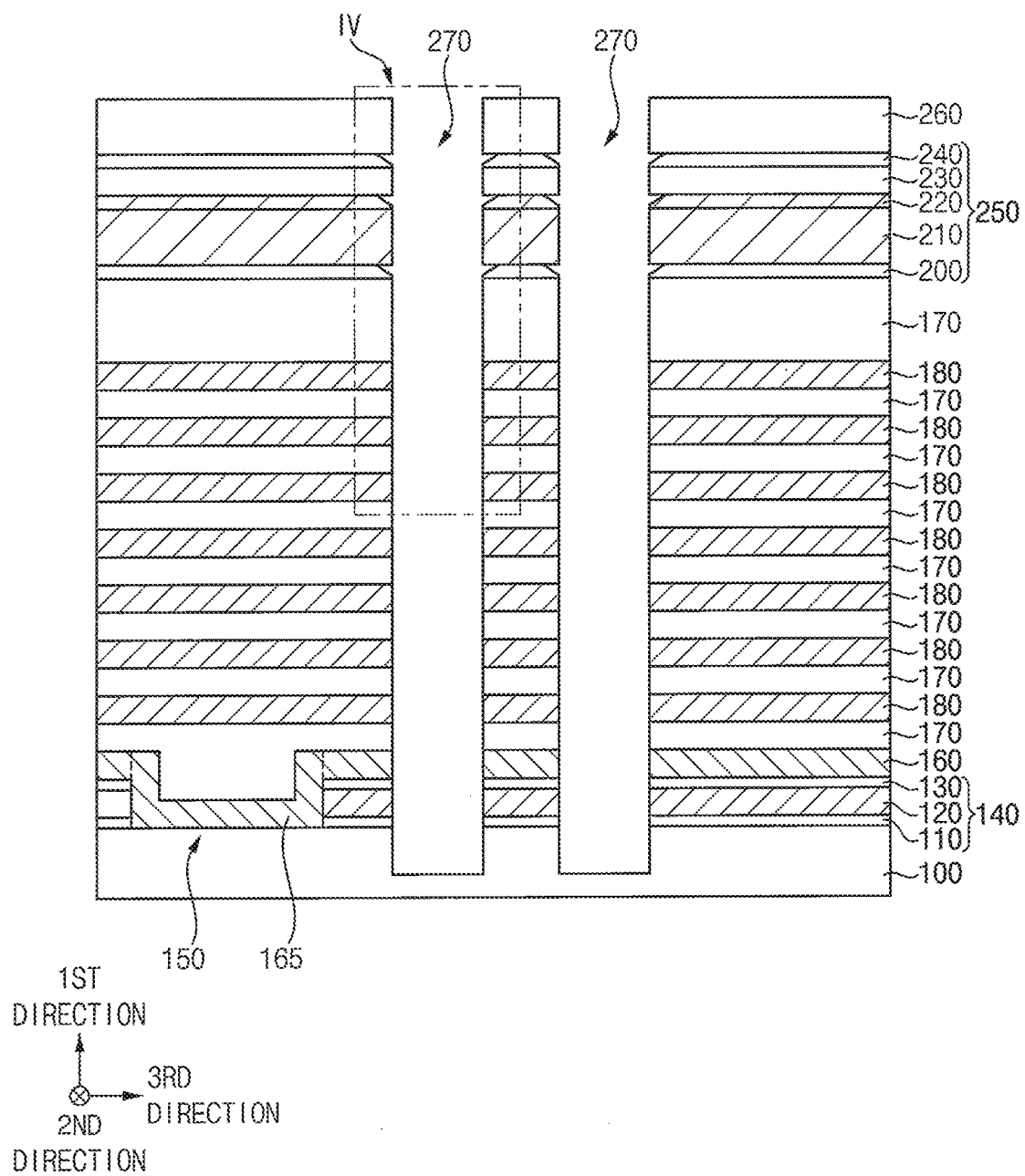
Figure 4:
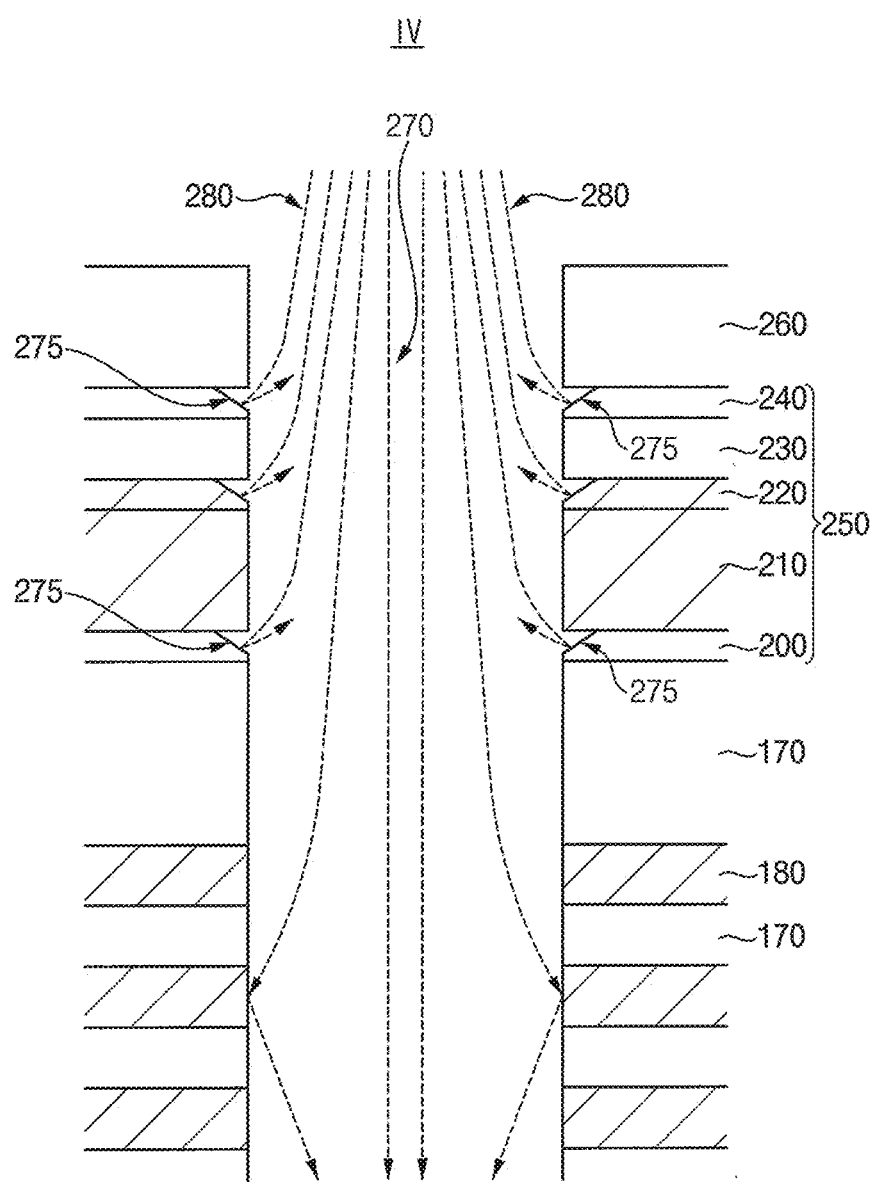

FIGS. 1 to 10 are cross-sectional views illustrating a method of manufacturing a semiconductor device, particularly, a NAND flash memory device in accordance with an example embodiment. FIG. 4 is an enlarged cross-sectional view of region IV of FIG. 3.

Figure 1:
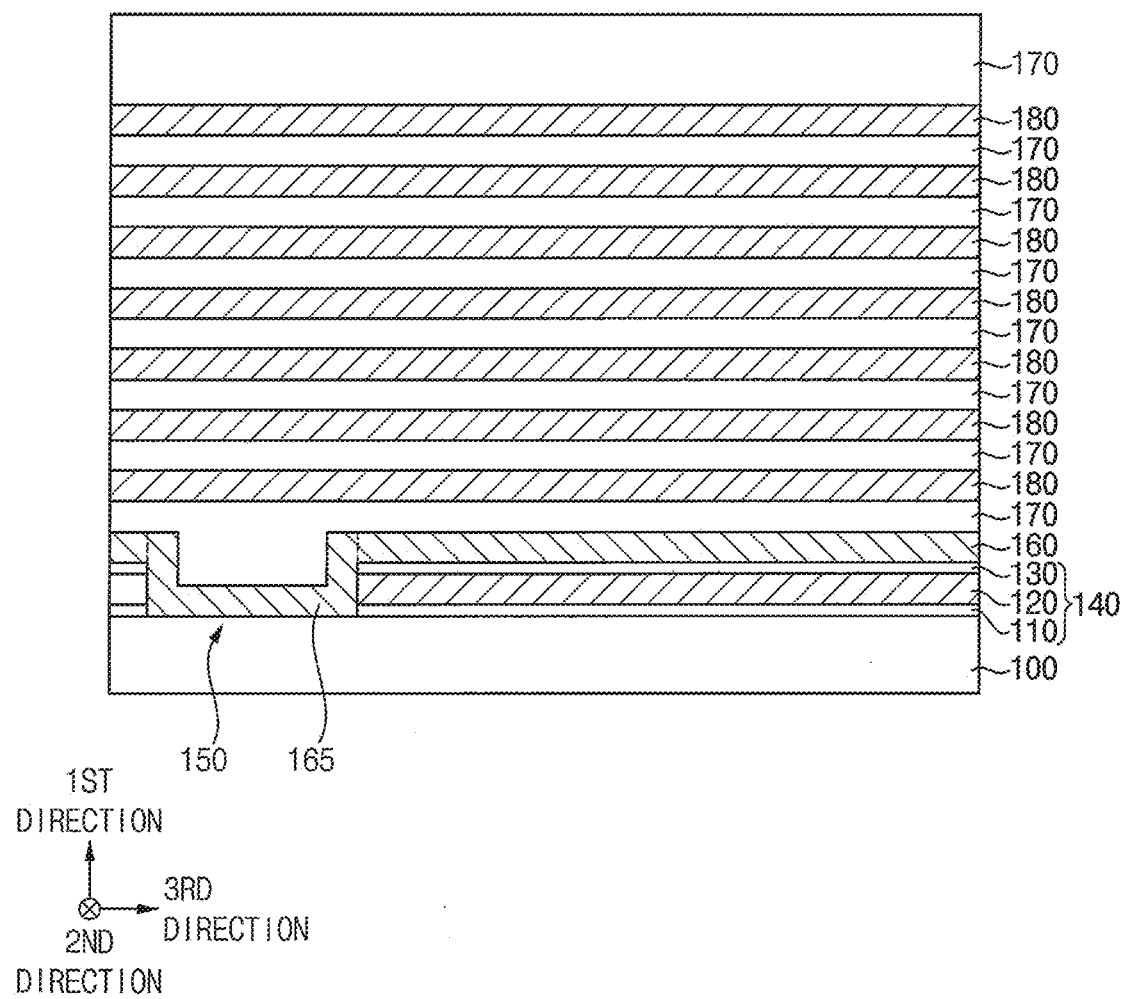
FIGS. 1 to 10 are cross-sectional views illustrating a method of manufacturing a semiconductor device, particularly, a NAND flash memory device in accordance with an example embodiment.

Referring to FIG. 1, a first sacrificial layer structure 140 may be formed on a substrate 100, the first sacrificial layer structure 140 may be partially removed to form a first opening 150 exposing an upper surface of the substrate 100, and a support layer 160 may be formed on the substrate 100 and the first sacrificial layer structure 140 to at least partially fill the first opening 150.

The substrate 100 may include silicon, germanium, silicon-germanium or a III-V group compound such as GaP, GaAs, or GaSb. In some example embodiments, the substrate 100 may be a silicon-on-insulator (SOI) substrate or a germanium-on-insulator (GOI) substrate.

The first sacrificial layer structure 140 may include first, second and third sacrificial layers 110, 120 and 130 sequentially stacked in the first direction. The first and third sacrificial layers 110 and 130 may include an oxide (e.g., silicon oxide), and the second sacrificial layer 120 may include a nitride (e.g., silicon nitride).

The support layer 160 may include a material having an etching selectivity with respect to the first to third sacrificial layers 110, 120 and 130 (e.g., polysilicon doped with n-type impurities or undoped polysilicon). The support layer 160 may have a uniform thickness, and thus a first recess may be formed on a portion of the support layer 160 in the first opening 150. Hereinafter, the portion of the support layer 160 in the first opening 150 may be referred to as a support pattern 165.

A first insulation layer 170 may be formed on the support layer 160 to fill the first recess. In an example embodiment, a planarization process may be further performed on an upper portion of the first insulation layer 170. The planarization process may include a chemical mechanical polishing (CMP) process and/or an etch back process.

A fourth sacrificial layer 180 and the first insulation layer 170 may be alternately and repeatedly stacked on the first insulation layer 170, and thus a mold layer including the first insulation layers 170 and the fourth sacrificial layers 180 alternately stacked may be formed. An upper most one of the first insulation layers 170 may have a thickness greater than those of other underlying ones of the first insulation layers 170.

The first insulation layer 170 may include an oxide (e.g., silicon oxide), and the fourth sacrificial layer 180 may include a material having an etching selectivity with respect to the first insulation layer 170 (e.g., a nitride such as silicon nitride).

Referring to FIG. 2, a second sacrificial layer structure 250 may be formed on the mold layer.

In some example embodiments, the second sacrificial layer structure 250 may include a fifth sacrificial layer 200, an etch stop layer 210, a sixth sacrificial layer 220, a second insulation layer 230 and a seventh sacrificial layer 240 sequentially stacked in the first direction.

In some example embodiments, the fifth sacrificial layer 200 may be formed by doping impurities into an upper portion of the uppermost one of the first insulation layers 170. The impurities may include a non-metal material that may be easily doped into the first insulation layer 170 including, for example, silicon oxide, and an etch rate of the fifth sacrificial layer 200 formed by doping the impurities into the first insulation layer 170 may increase when compared to an etch rate of the first insulation layer 170. The non-metal material may include, for example, hydrogen, boron, carbon, phosphorus, or arsenic. In some example embodiments, the fifth sacrificial layer 200 may be formed by providing an impurity source gas containing the above impurities during the formation of the uppermost one of the first insulation layers 170.

In some other example embodiments, the fifth sacrificial layer 200 may be formed by a deposition process on the uppermost one of the first insulation layers 170 to include a ternary compound containing silicon and other two elements. The ternary compound may have a chemical formula of $SiA_{1-x}B_x$. Each of A and B may include, for example, boron, carbon, nitrogen, oxygen, or phosphorus. For example, the fifth sacrificial layer 200 may include silicon oxynitride, silicon carbonitride, or silicon phosphorus nitride. The fifth sacrificial layer 200 may be more porous than the first insulation layer 170, and thus may have an etch rate greater than that of the first insulation layer 170.

In an example embodiment, a concentration of each of the elements included in the fifth sacrificial layer 200 except for silicon may gradually increase or decrease in the first direction. Thus, an etch rate of the fifth sacrificial layer 200 may gradually increase or decrease in the first direction.

The etch stop layer 210 may include a nitride (e.g., silicon nitride).

The sixth sacrificial layer 220 may be formed by doping impurities into an upper portion of the etch stop layer 210 including, for example, silicon nitride, and the impurities may include elements similar to or the same as those doped into the first insulation layer 170 to form the fifth sacrificial layer 200, which includes, for example, hydrogen, boron, carbon, phosphorus, or arsenic. In some example embodiments, the sixth sacrificial layer 220 may be formed by providing an impurity source gas including the above impurities during the formation of the etch stop layer 210.

The sixth sacrificial layer 220 may also be formed by a deposition process on the etch stop layer 210 to include a ternary compound containing silicon and other two elements. The ternary compound may have a chemical formula of $SiA_{1-x}B_x$. Each of A and B may include, for example, boron, carbon, nitrogen, oxygen, or phosphorus. The sixth sacrificial layer 220 may have an etch rate greater than that of the etch stop layer 210.

In an example embodiment, a concentration of each of the elements included in the sixth sacrificial layer 220 except for silicon may gradually increase or decrease in the first direction. Thus, an etch rate of the sixth sacrificial layer 220 may gradually increase or decrease in the first direction.

The second insulation layer 230 may include a material substantially the same as or similar to that of the first insulation layer 170, For example, the second insulation layer 230 may include an oxide (e.g., silicon oxide).

The seventh sacrificial layer 240 may be formed by processes substantially the same as or similar to those for forming the fifth sacrificial layer 200. The seventh sacrificial layer 240 may include, for example, silicon oxide doped with hydrogen, boron, carbon, phosphorus, or arsenic. In some example embodiments, the seventh sacrificial layer 240 may include a ternary compound including silicon and other two elements (e.g., boron, carbon, nitride, oxygen, or phosphorus). A concentration of each of the other two elements included in the seventh sacrificial layer 240 may increase or decrease in the first direction.

An etching process may be performed on the second sacrificial layer structure 250 and the mold layer using a photoresist pattern as an etching mask, and a trimming process in which an area of the photoresist pattern is reduced by a given ratio may be performed. The etching process and the trimming process may be alternately and repeatedly performed to form a mold including a plurality of steps each having the fourth sacrificial layer 180 and the first insulation layer 170. Hereinafter, the "step" may be defined by not only an exposed portion but also a non-exposed portion of the fourth sacrificial layer 180 and the first insulation layer 170 at an adjacent level in the first direction, and the exposed portion thereof may define a "step."

Referring to FIGS. 3 and 4, a hard mask 260 including, for example, amorphous carbon layer (ACL) or spin-on-hardmask (SOH) may be formed on the second sacrificial layer structure 250, and a dry etching process may be performed using the hard mask 260 as an etching mask to form a channel hole 270 through the second sacrificial layer structure 250, the mold, the support layer 160 and the first sacrificial layer structure 140.

In some example embodiments, the dry etching process may be performed by a plasma etching process (e.g., a reactive ion etching process). The dry etching process may be performed using, for example, $CF_x$ gas, oxygen gas, $C_4F_8$, or $CF_2Br_2$, as a dry etching gas 280, and positive ions, radicals, etc. generated from the etching gas 280 to which energy is provided may anisotropically etch the second sacrificial layer structure 250, the mold, the support layer 160 and the first sacrificial layer structure 140 to form the channel hole 270.

The fifth to seventh sacrificial layers 200, 220 and 240 included in the second sacrificial layer structure 250 having relatively high etching rates with respect to the etching gas 280 may be etched more than the first insulation layer 170 or the fourth sacrificial layer 180 to form a second recess 275 on a sidewall of the second sacrificial layer structure (e.g., on the fifth to seventh sacrificial layers 200, 220 and 240) at a boundary with the channel hole 270. The positive ions and radicals in the etching gas 280 may be reflected from the second recess 275 upwardly, and may be rarely reflected toward the mold.

If the second sacrificial layer structure 250 does not include the fifth to seventh sacrificial layers 200, 220 and 240, the positive ions and radicals may be reflected from the second sacrificial layer structure 250 downwardly more than upwardly, and thus a sidewall of the mold (e.g., a sidewall of the fourth sacrificial layer 180) under the second sacrificial layer structure 250 may be excessively etched to form the second recess 275 on the sidewall of the fourth sacrificial layer 180. In this case, after the fourth sacrificial layer 180 is replaced with a gate electrode 410 (refer to FIG. 9), leakage current may be generated from the gate electrode 410 through the second recess 275, thereby deteriorating reliability of the semiconductor device.

However, in some example embodiments, the fifth to seventh sacrificial layers 200, 220 and 240 may be formed, and thus the second recess 275 may be formed on the sidewall of the second sacrificial layer structure 250, and the second recess 275 may be rarely formed on the sidewall of the underlying mold. Accordingly, the leakage current from the gate electrode 410 replacing the fourth sacrificial layer 180 in the mold may be reduced.

In some example embodiments, the dry etching process may be performed until the channel hole 270 exposes an upper surface of the substrate 100, and further the channel hole 270 may extend through an upper portion of the substrate 100. A plurality of channel holes 270 may be formed in the second and third directions to form a channel hole array.

Figure 5:
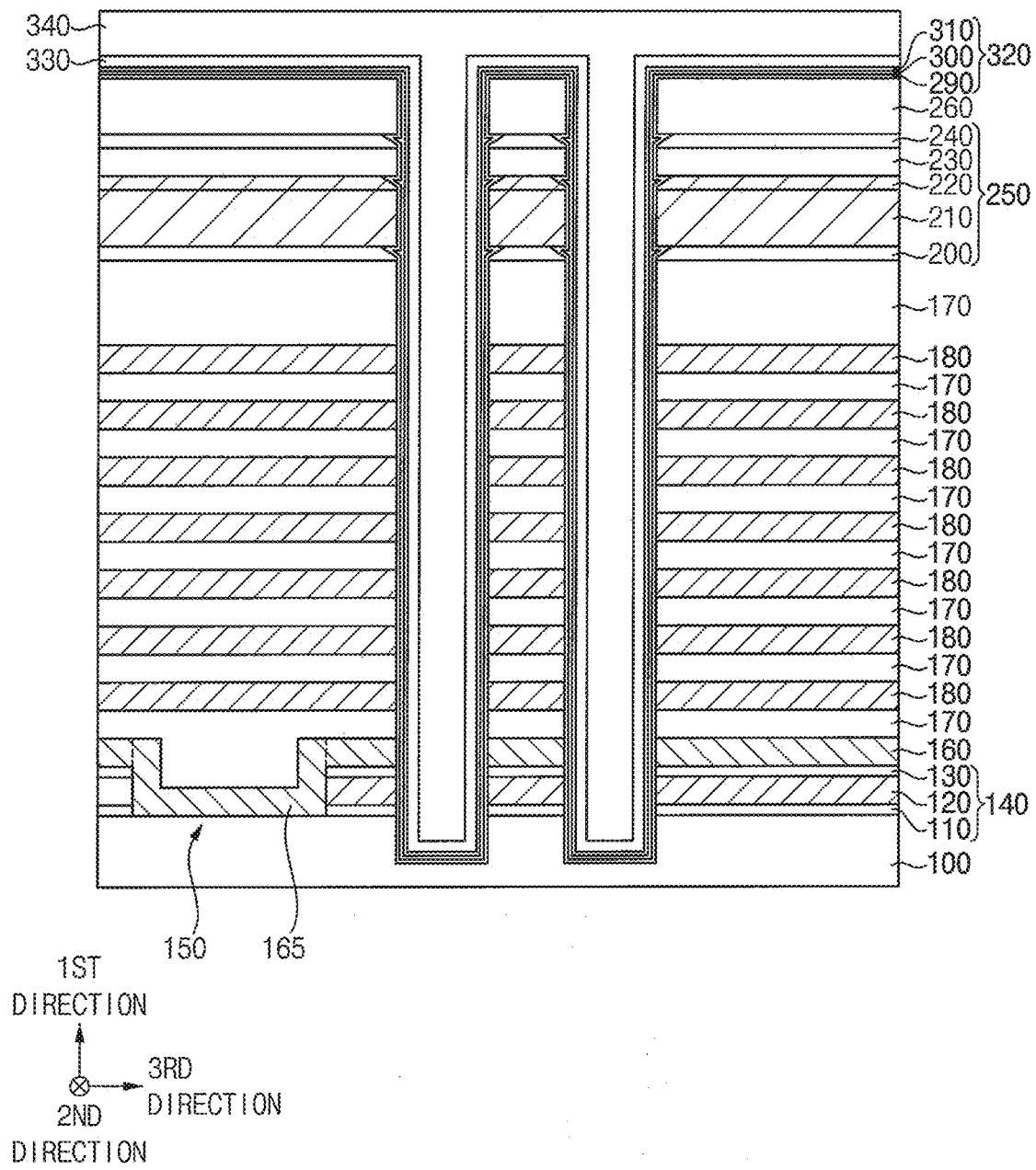

Referring to FIG. 5, a charge storage layer structure 320 and a channel layer 330 may be sequentially formed along a boundary of the channels hole 270 and along the second recess 275, on the exposed upper surface of the substrate 100 and on the hard mask 260, and a filling layer 340 may be formed on the channel layer 330 to fill the channel hole 270. The charge storage layer structure 320 may include a first blocking layer 290, a charge storage layer 300 and a tunnel insulation layer 310 sequentially stacked.

The first blocking layer 290 and the tunnel insulation layer 310 may include an oxide (e.g., silicon oxide), and the charge storage layer 300 may include a nitride (e.g., silicon nitride). The channel layer 330 may include, for example, polysilicon or single crystalline silicon that is undoped or lightly doped with impurities, and the filling layer 340 may include an oxide (e.g., silicon oxide).

Figure 6:
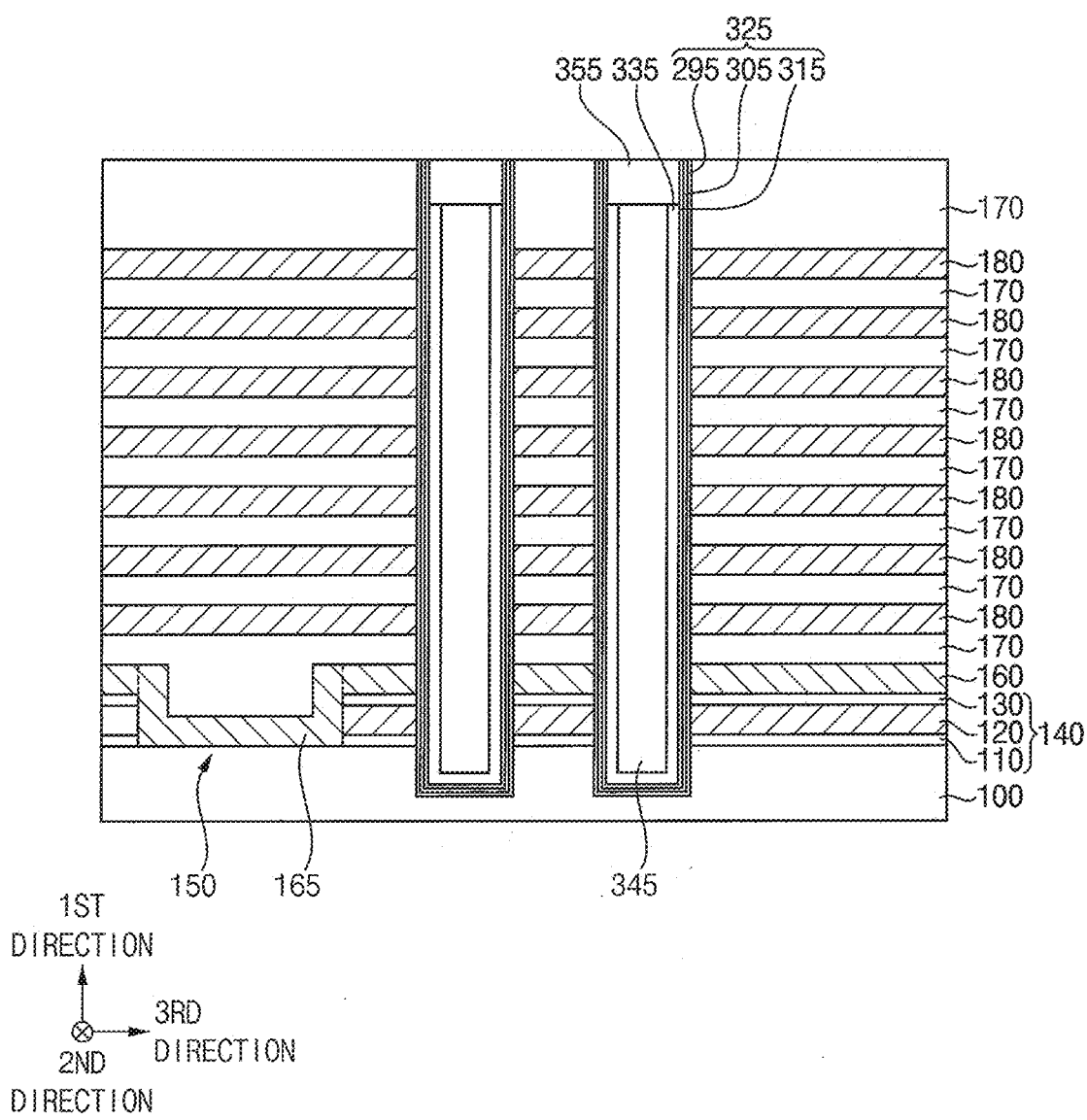

Referring to FIG. 6, the filling layer 340, the channel layer 330 and the charge storage layer structure 320 may be planarized until an upper surface of the etch stop layer 210 is exposed, and further, the uppermost one of the first insulation layers 170 may be exposed.

By the planarization process, the hard mask 260 and the second sacrificial layer structure 250 may be removed, and a filling pattern 345, a channel 335 and a charge storage structure 325 may be formed in the channel hole 270. The charge storage structure 325 may include a first blocking pattern 295, a charge storage pattern 305 and a tunnel insulation pattern 315 sequentially stacked on a bottom and a side of the channel hole 270.

In some example embodiments, the filling pattern 345 may have a pillar shape extending in the first direction, and each of the channel 335 and the charge storage structure 325 may have a cup-like shape.

As the channel holes 270 define the channel hole array, the channels 335 in the channel holes 270 may define a channel array.

Upper portions of the filling pattern 345 and the channel 335 may be removed to form a third recess, a pad layer may be formed on the filling pattern 345, the channel 335, the charge storage structure 325 and the uppermost one of the first insulation layers 170 to fill the third recess, and the pad layer may be planarized until an upper surface of the uppermost one of the first insulation layers 170 is exposed to form a pad 355 on the filling pattern 345 and the channel 335. The pad 355 may contact an upper portion of an inner sidewall of the charge storage structure 325. The pad 355 may include, for example, doped polysilicon.

The charge storage structure 325, the channel 335, the filling pattern 345 and the pad 355 in the channel hole 270 may form a memory channel structure.

Figure 7:
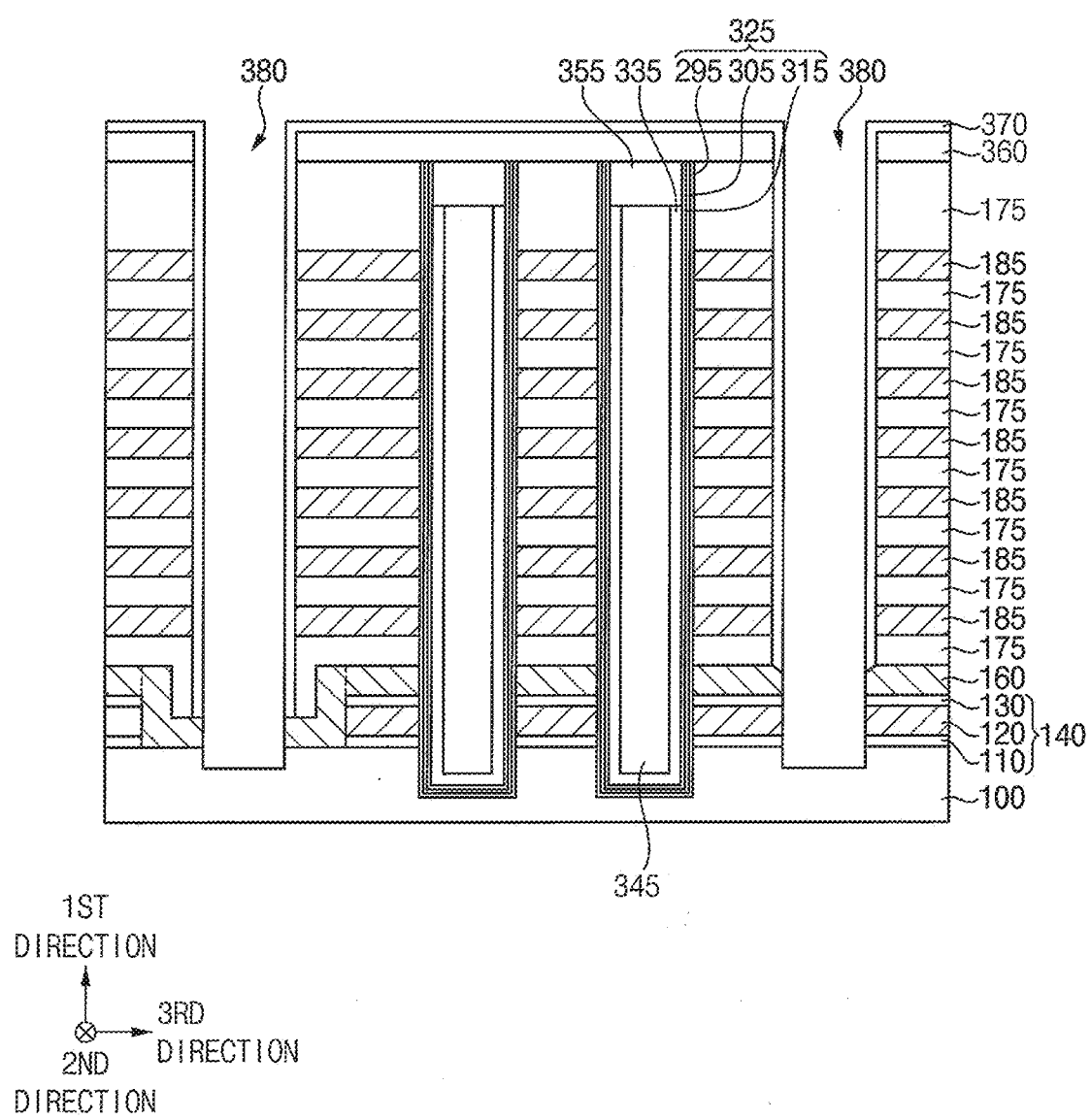

Referring to FIG. 7, a first insulating interlayer 360 may be formed on the uppermost one of the first insulation layers 170, the pad 355 and the charge storage structure 325, and a second opening 380 may be formed partially through the first insulating interlayer 360 and the mold.

In some example embodiments, the dry etching process may be performed until the second opening 380 exposes an upper surface of the support layer 160 or the support pattern 165, and further, the second opening 380 may extend through an upper portion of the support layer 160 or the support pattern 165. As the second opening 380 is formed, the first insulation layer 170 and the fourth sacrificial layer 180 included in the mold may be exposed.

In some example embodiments, the second opening 380 may extend in the second direction, and a plurality of second openings 380 may be formed or arranged in the third direction. As the second opening 380 is formed, the first insulation layer 170 may be divided into first insulation patterns 175, each of which may extend in the second direction, and the fourth sacrificial layer 180 may be divided into fourth sacrificial patterns 185, each of which may extend in the second direction.

A spacer layer may be formed on a sidewall of the second opening 380, the upper surfaces of the support layer 160 and the support pattern 165 that are exposed by the second opening 380, and the first insulating interlayer 360, and may be anisotropically etched so that portions of the spacer layer on the support layer 160 and the support pattern 165 may be removed to form a spacer 370, and the upper surfaces of the support layer 160 and the support pattern 165 may be partially exposed. In some example embodiments, the spacer 370 may include undoped amorphous silicon or undoped polysilicon.

The exposed portions of the support layer 160 and the support pattern 165 and a portion of the first sacrificial layer structure 140 thereunder may be removed to enlarge the second opening 380. Thus, the second opening 380 may expose an upper surface of the substrate 100. In some example embodiments, the second opening 380 may extend through an upper portion of the substrate 100.

When the first sacrificial layer structure 140 is partially removed, a sidewall of the second opening 380 may be covered by the spacer 370, and the spacer 370 may include a material different from the first sacrificial layer structure 140, and thus the first insulation pattern 175 and the fourth sacrificial pattern 185 included in the mold might not be removed.

Figure 8:
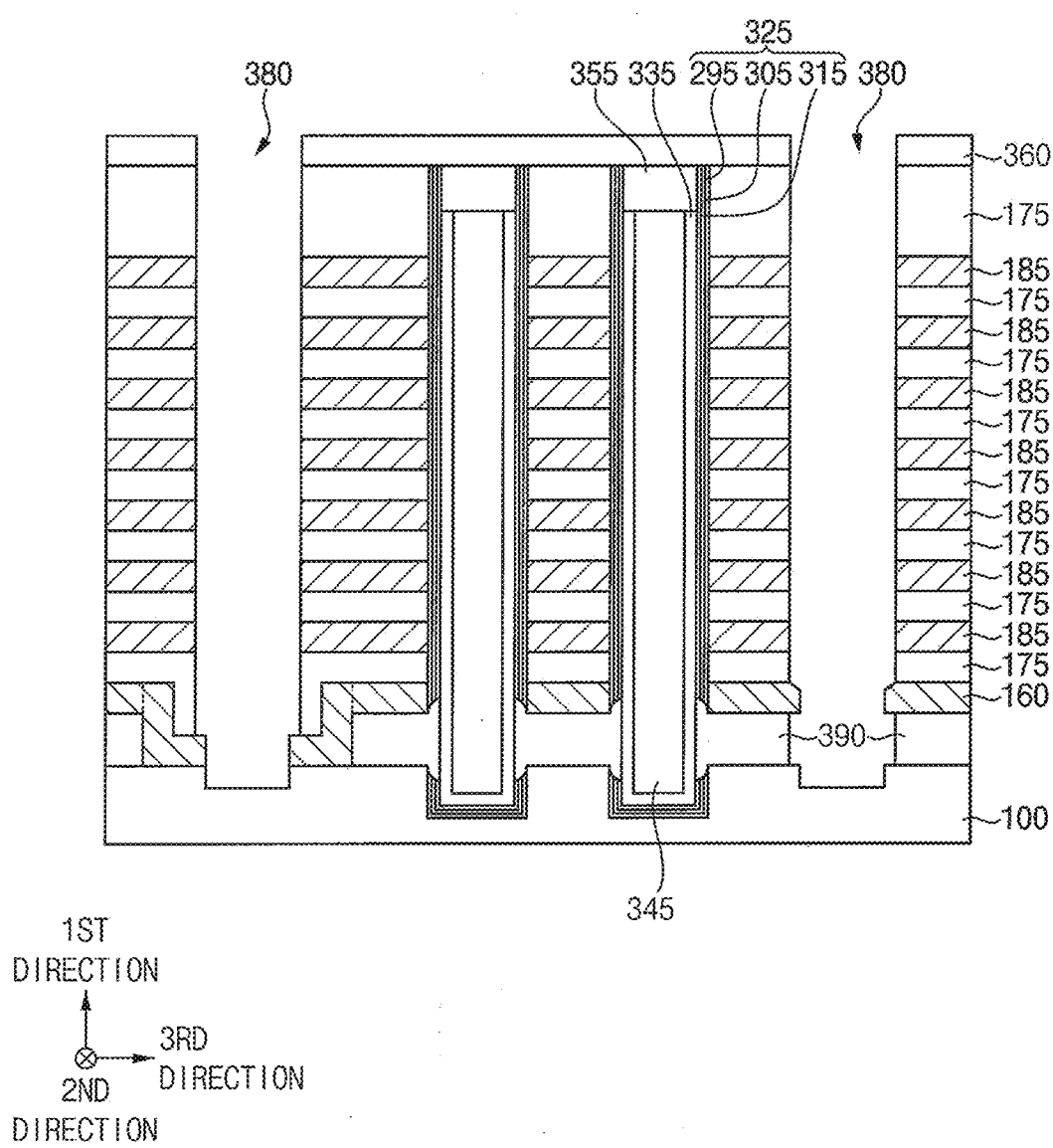

Referring to FIG. 8, the first sacrificial layer structure 140 exposed by the second opening 380 may be removed to form a first gap exposing a lower portion of an outer sidewall of the charge storage structure 325, and further, a portion of the charge storage structure 325 exposed by the first gap may be removed to expose an a lower portion of an outer sidewall of the channel 335.

The first sacrificial layer structure 140 and the charge storage structure 325 may be removed by a wet etching process, using, for example, fluoric acid and/or phosphoric acid. When the first gap is formed, the support layer 160, the support pattern 165, the channel 335 and the filling pattern 345 might not be removed and support the mold.

As the first gap is formed, the charge storage structure 325 may be divided into an upper portion extending through the mold to cover most portion of the outer sidewall of the channel 335 and a lower portion covering a lower surface of the channel 335 on the channel 335 and formed on the substrate 100.

After removing the spacer 370, a channel connection pattern 390 may be formed to fill the first gap.

The channel connection pattern 390 may be formed by forming a channel connection layer on the sidewall of the second opening 380, the exposed upper surface of the substrate 100, and the first insulating interlayer 360, and performing an etch back process on the channel connection layer. The channel connection layer may include, for example, polysilicon doped with n-type impurities. As the channel connection pattern 390 is formed, the channels 335 between neighboring ones of the second openings 380 in the third direction may be connected with each other to form a channel block.

Figure 9:
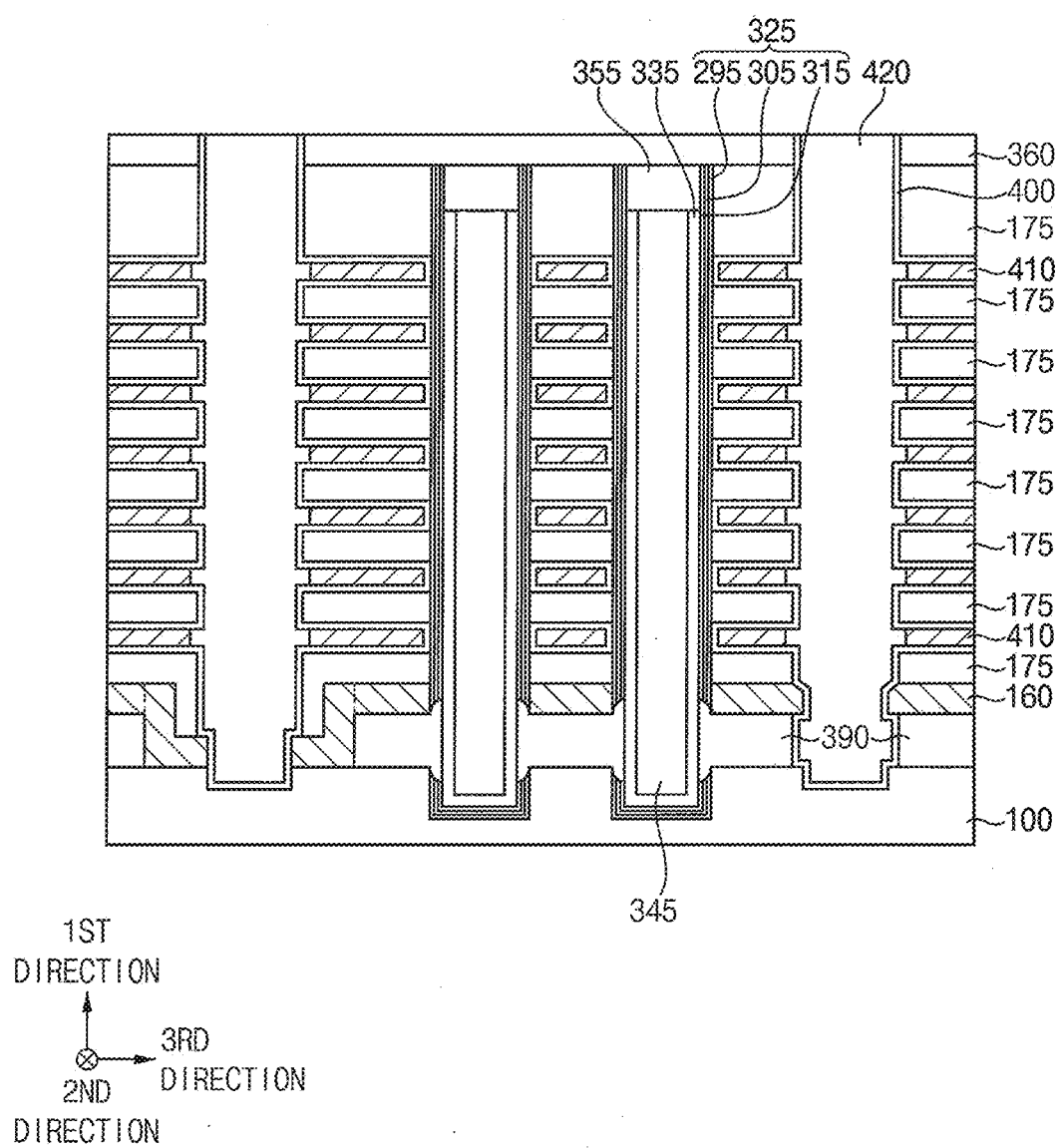

Referring to FIG. 9, for example, n-type impurities may be doped into the upper portion of the substrate 100 exposed by the second opening 380 to form an impurity region.

The fourth sacrificial patterns 185 may be removed to form a second gap exposing an outer sidewall of the charge storage structure 325. The fourth sacrificial patterns 185 may be removed by a wet etching process using, for example, phosphoric acid ($H_3PO_4$) or sulfuric acid ($H_2SO_4$).

A second blocking layer may be formed on the outer sidewalls of the charge storage structures 325 exposed by the second gaps, inner walls of the second gaps, surfaces of the first insulation patterns 175, sidewalls of the support layer 160 and the support pattern 165, a sidewall of the channel connection pattern 390, the upper surface of the substrate 100, and an upper surface of the first insulating interlayer 360, and a gate electrode layer may be formed on the second blocking layer to fill the second gaps and the second opening 380. The gate electrode layer may include a gate barrier layer and a gate conductive layer sequentially stacked.

The gate electrode layer may be partially removed to form a gate electrode 410 in each of the second gaps. In some example embodiments, the gate electrode layer may be partially removed by a wet etching process.

In some example embodiments, the gate electrode 410 may extend in the second direction, and a plurality of gate electrodes 410 may be spaced apart from each other in the first direction to form a gate electrode structure. Additionally, a plurality of gate electrode structures may be spaced apart from each other in the third direction by the second opening 380. The gate electrodes 410 included in each of the gate electrode structures may be staked in a staircase shape in which extension lengths in the second direction decrease in a stepwise manner from a lowermost level toward an uppermost level.

An end portion in the second direction of each of the gate electrodes 410 that is not overlapped with overlying gate electrodes 410 in the first direction may be referred to as a conductive pad. That is, the conductive pad may correspond to the step in the gate electrode structure.

In some example embodiments, each of the gate electrode structures may include first to third gate electrodes sequentially stacked in the first direction. In some example embodiments, the first gate electrode may be formed at a lowermost level, and may serve as a ground selection line (GSL). The third gate electrode may be formed at an uppermost level and a second level from above, and may serve as a string selection line (SSL). The second gate electrode may be formed at a plurality of levels between the first and third gate electrodes, and may serve as word lines, respectively. However, the numbers of levels at which the first to third gate electrodes are formed might not be limited to the above, and may be varied. Additionally, each of the gate electrode structures may include fourth gate electrode under the first gate electrode and/or over the third gate electrode. The fourth gate electrode may be formed at one or a plurality of levels, and may serve as a gate induced drain leakage (GIDL) electrode, which may use GIDL phenomenon to enable body erase. Some of the second gate electrodes may serve as dummy word lines.

Each of the gate electrodes 410 may include a conductive pattern and a barrier pattern covering lower and upper surfaces and a sidewall of the conductive pattern. The conductive pattern may include a low resistance metal (e.g., tungsten, titanium, tantalum, or platinum) and the barrier pattern may include a metal nitride (e.g., titanium nitride or tantalum nitride).

A division layer may be formed on the second blocking layer to fill the second opening 380, and the division layer and the second blocking layer may be planarized until the upper surface of the first insulating interlayer 360 is exposed. Thus, the second blocking layer may be transformed into a second blocking pattern 400, and the division layer may form a division pattern 420 extending in the second direction in the second opening 380.

The second blocking pattern 400 may include a metal oxide (e.g., aluminum oxide or hafnium oxide) and the division pattern 420 may include an oxide (e.g., silicon oxide).

Figure 10:
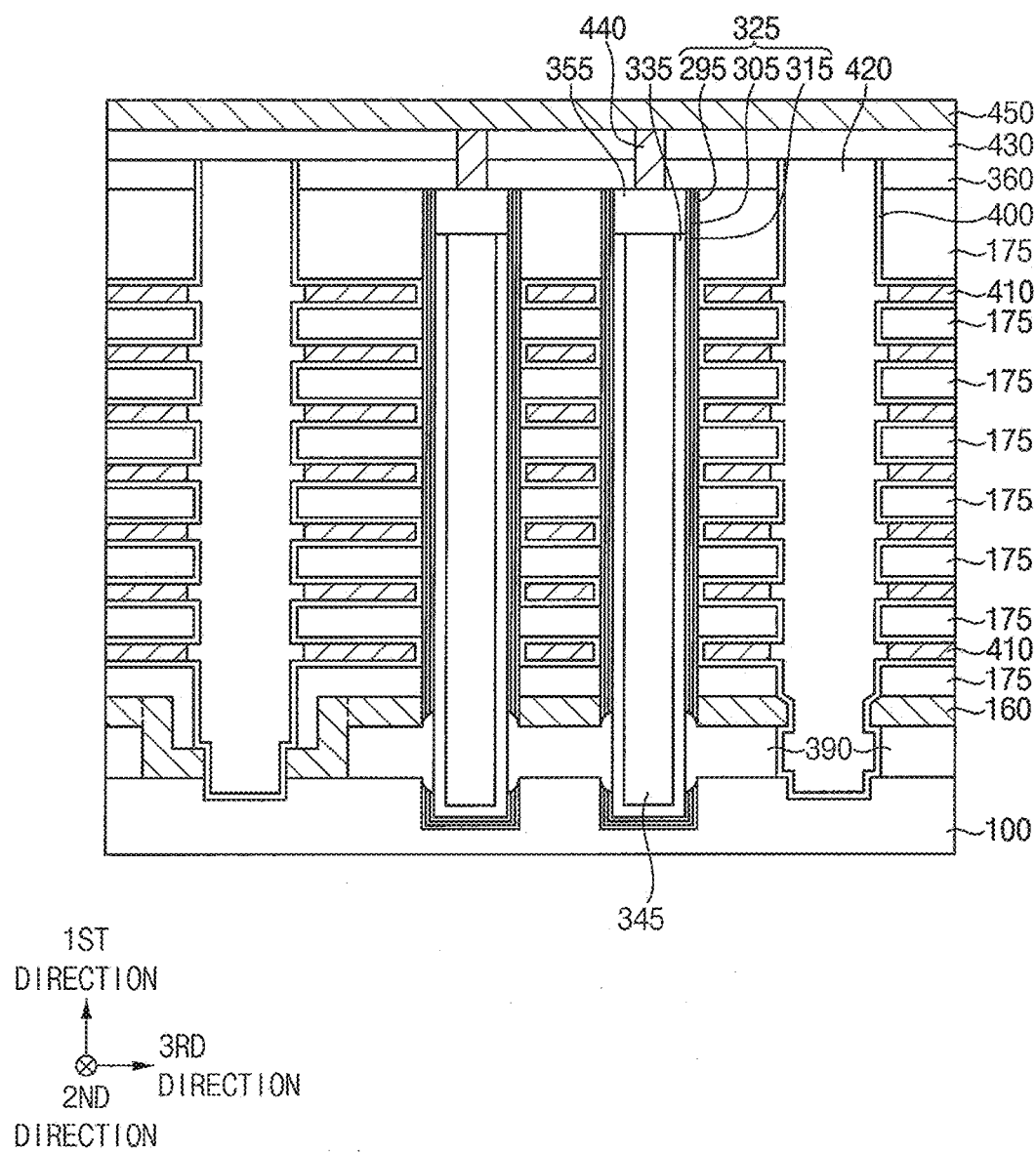

Referring to FIG. 10, a second insulating interlayer 430 may be formed on the first insulating interlayer 360, the division pattern 420 and the second blocking pattern 400, and a contact plug 440 may be formed through the first and second insulating interlayers 360 and 430 to contact an upper surface of the pad 355.

A bit line 450 contacting an upper surface of the contact plug 440 may be formed. In some example embodiments, the bit line 450 may extend in the third direction, and a plurality of bit lines 450 may be spaced apart from each other in the second direction.

The contact plug 440 and the bit line 450 may include, for example, a metal, a metal nitride, a metal silicide, or doped polysilicon.

An upper wiring for applying electrical signals to the contact plug 440 may be further formed to complete the fabrication of the semiconductor device.

As illustrated above, in the method of manufacturing the semiconductor device, the second sacrificial layer structure 250 that includes the etch stop layer 210 and the second insulation layer 230 on the mold may further include the fifth to seventh sacrificial layers 200, 220 and 240 having etch rates greater than those of the etch stop layer 210 and the second insulation layer 230. Thus, during the dry etching process for forming the channel hole 270, the second recess 275 may be formed on the sidewalls of the fifth to seventh sacrificial layers 200, 220 and 240, and the positive ions and radicals generated from the etching gas 280 may be reflected from the second recess 275 upwardly and may be rarely reflected downwardly. Accordingly, the second recess 275 might not be formed on the sidewall of the mold under the second sacrificial layer structure 250 (e.g., on the sidewall of the fourth sacrificial layer 180), and thus leakage current from the gate electrodes 410 through the second recess 275 may be prevented or reduced.

Figure 11:
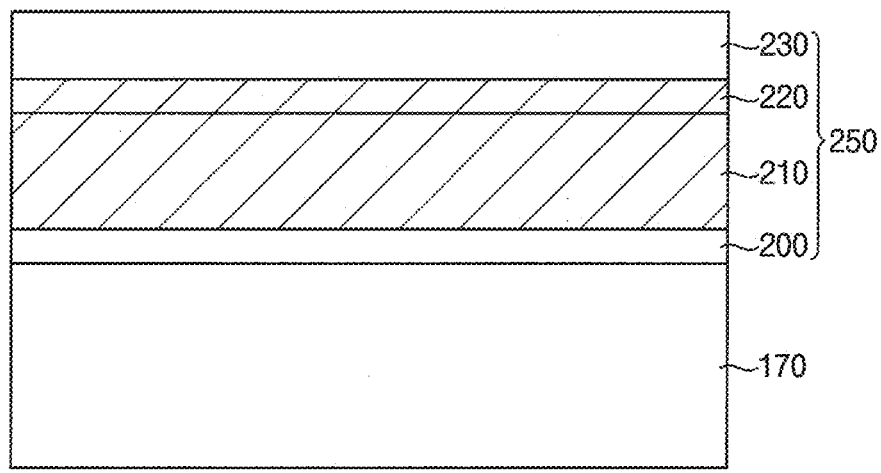
FIGS. 11 to 13 are cross-sectional views illustrating the second sacrificial layer structures used in a method of manufacturing a semiconductor device in accordance with an example embodiment.
Figure 12:
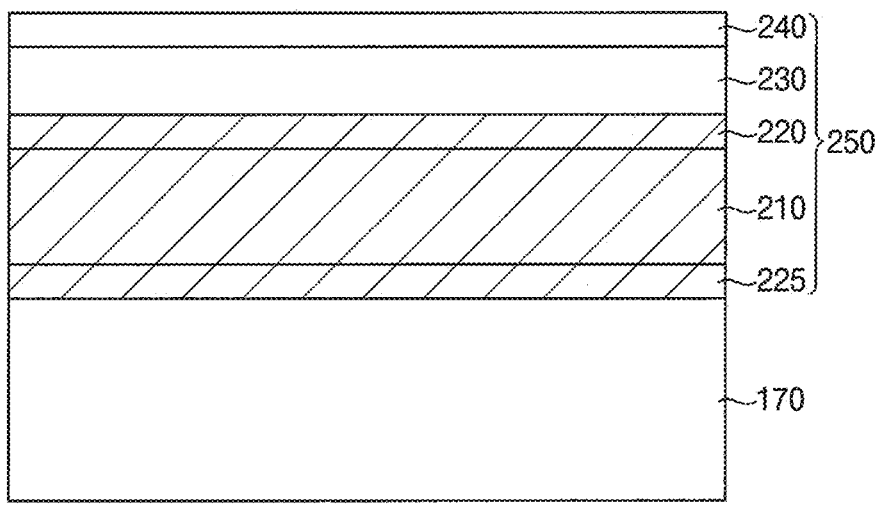
Figure 13:
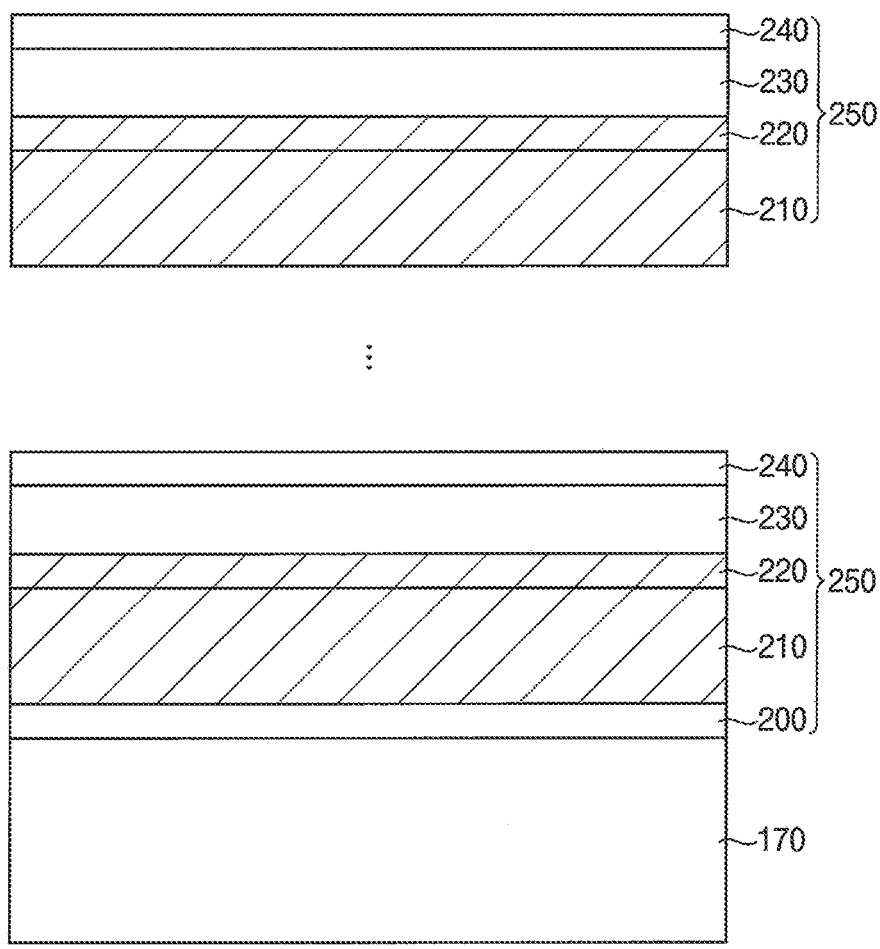

FIGS. 11 to 13 are cross-sectional views illustrating the second sacrificial layer structures used in a method of manufacturing a semiconductor device in accordance with an example embodiment.

Referring to FIG. 11, the second sacrificial layer structure 250 may include the fifth sacrificial layer 200, the etch stop layer 210, the sixth sacrificial layer 220 and the second insulation layer 230 sequentially stacked on the uppermost one of the first insulation layers 170, and might not include the seventh sacrificial layer 240.

Referring to FIG. 12, the second sacrificial layer structure 250 may include an eighth sacrificial layer 225, the etch stop layer 210, the sixth sacrificial layer 220, the second insulation layer 230 and the seventh sacrificial layer 240 sequentially stacked on the uppermost one of the first insulation layers 170.

That is, the second sacrificial layer structure 250 may include the eighth sacrificial layer 225 instead of the fifth sacrificial layer 200, and the eighth sacrificial layer 225 may be formed by processes substantially the same as or similar to those for forming the sixth sacrificial layer 220 to include a material substantially the same as or similar to that of the sixth sacrificial layer 220.

For example, during the deposition process for forming the etch stop layer 210, the impurity source gas may be provided at an initial period and a last period to form the eighth and sixth sacrificial layers 225 and 220, respectively.

During the deposition process for forming the second insulation layer 230, the impurity source gas may be provided at an initial period to form a ninth sacrificial layer (not shown), and in this case, the second insulation layer 230 may be formed on the ninth sacrificial layer.

In some example embodiment, the process for forming the fifth sacrificial layer 200 might not be skipped, and the fifth sacrificial layer 200 may be further formed on the uppermost one of the first insulation layers 170.

Referring to FIG. 13, a plurality of second sacrificial layer structures 250 may be formed on the uppermost one of the first insulation layers 170.

Some of the second sacrificial layer structures 250 might not include some of the fifth to seventh sacrificial layers 200, 220 and 240, for example, the fifth sacrificial layer 200.

As illustrated with reference to FIGS. 11 to 13, sacrificial layers having relatively high etch rates may be further formed between the etch stop layer 210 and the second insulation layer 230 in the second sacrificial layer structure 250, between the second sacrificial layer structure 250 and the uppermost one of the first insulation layers 170, and/or between the second sacrificial layer structure 250 and the hard mask 260, and thus the second recess 275 may be prevented or mitigated from being formed on the sidewall of the mold under the second sacrificial layer structure 250.

Figure 14:
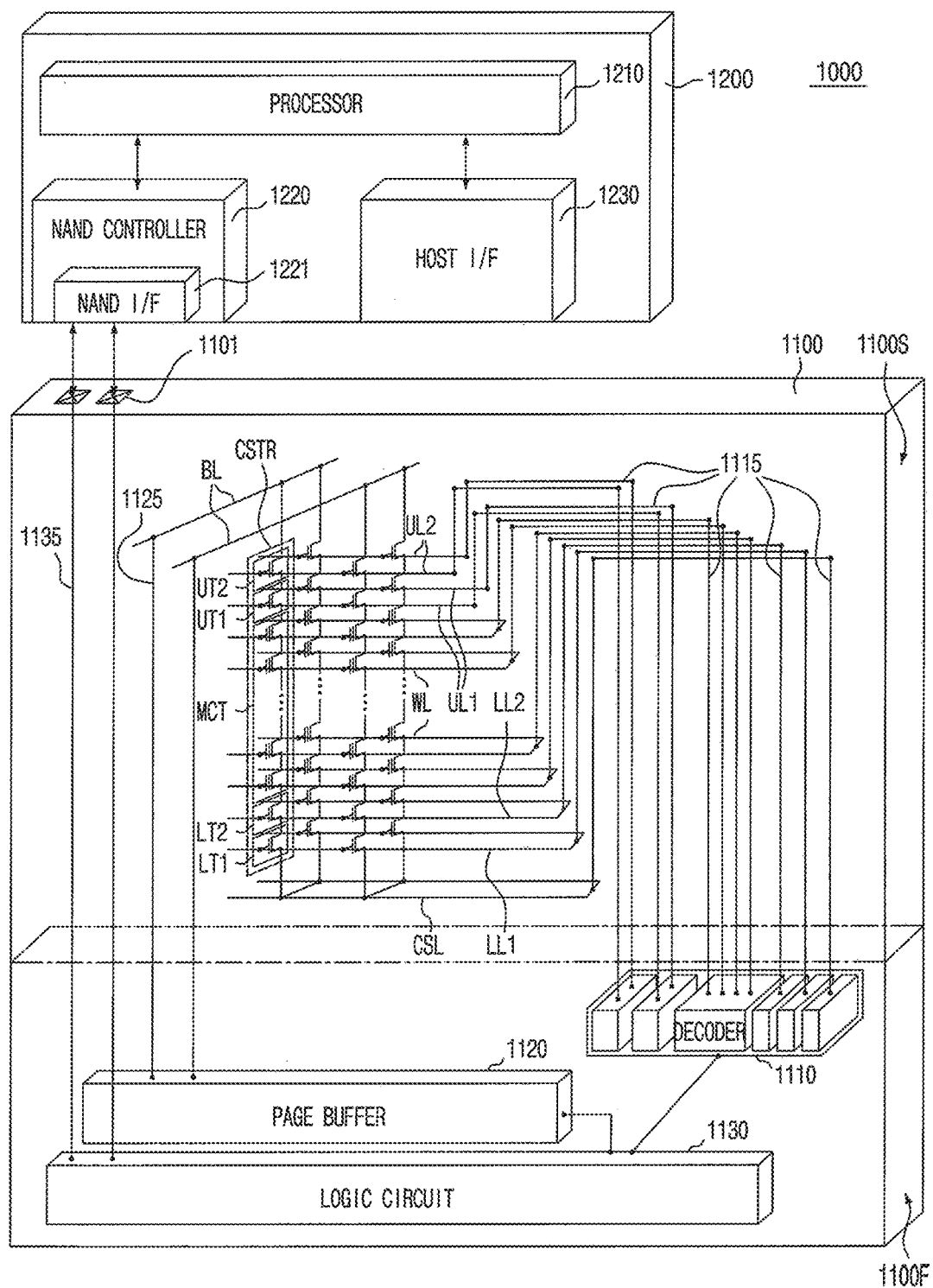
FIG. 14 is a schematic diagram illustrating an electronic system including a semiconductor device, that is, a NAND flash memory device in accordance with an example embodiment.

FIG. 14 is a schematic diagram illustrating an electronic system including a semiconductor device, that is, a NAND flash memory device in accordance with an example embodiment.

Referring to FIG. 14, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device that includes one or a plurality of semiconductor devices 1100.

The semiconductor device 1100 may be a non-volatile memory device, for example, the NAND flash memory device illustrated with reference to FIG. 10. The semiconductor device 1100 may include a first structure 1100F and a second structure 1100S on the first structure 1100F. In the drawing, the first structure 1100F is under the second structure 1100S, however, the inventive concepts may not be limited thereto, and the first structure 1100F may be beside or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In some example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When control command is received from the outside host through the host interface 1230, the processor 1210 may control the semiconductor device 1100 in response to the control command.

Figure 15:
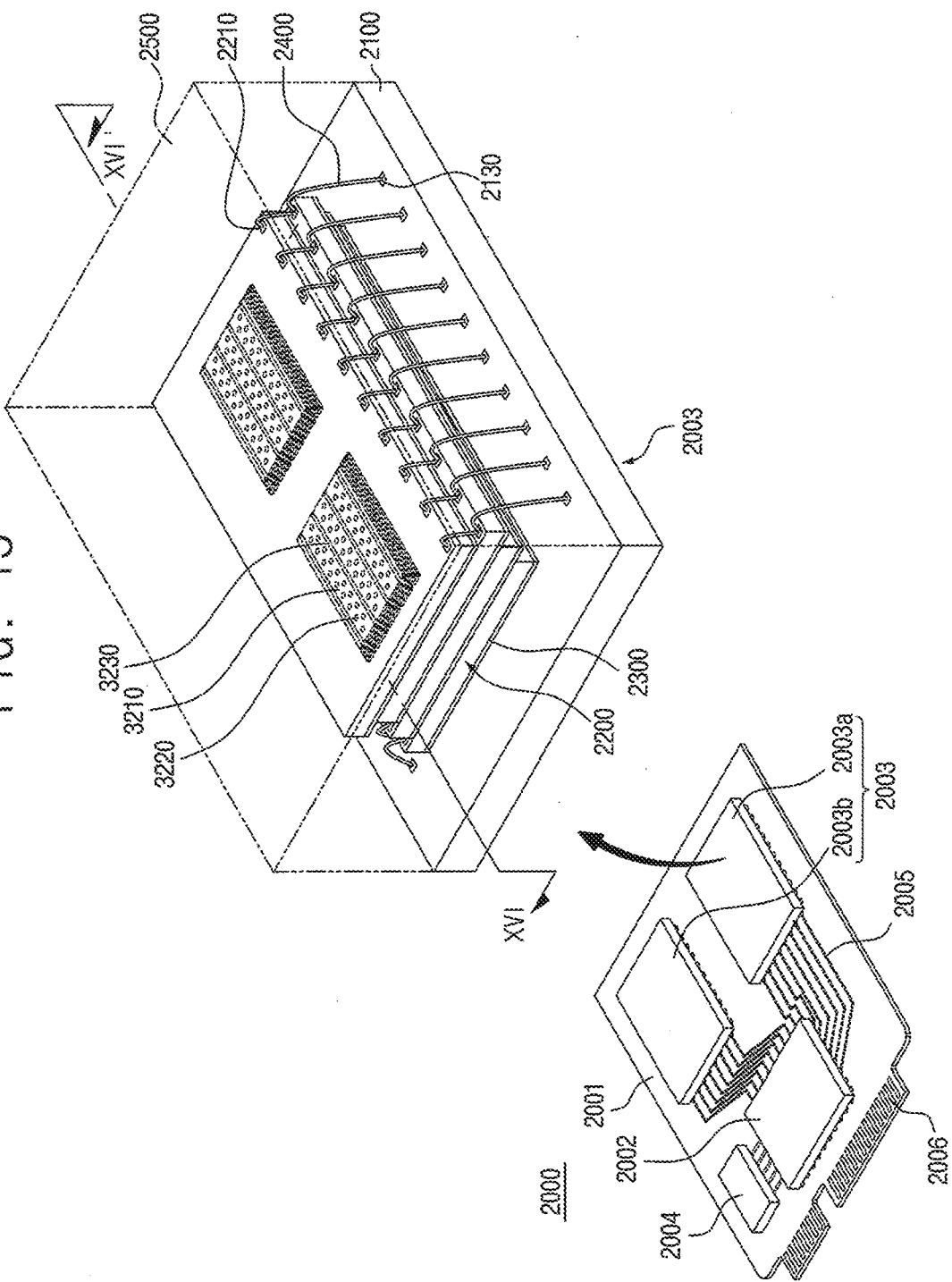
FIG. 15 is a schematic perspective view illustrating an electronic system including a semiconductor device, that is, a NAND flash memory device in accordance with an example embodiment.

FIG. 15 is a schematic perspective view illustrating an electronic system including a semiconductor device, that is, a NAND flash memory device in accordance with an example embodiment.

Referring to FIG. 15, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on communication interface between the electronic system 2000 and the outside host. In some example embodiments, the electronic system 2000 may communicate with the outside host according to one of a USB, peripheral component interconnect express (PCI-Express), serial advanced technology attachment (SATA), or M-Phy for universal flash storage (UFS). In some example embodiments, the electronic system 2000 may be operated by power source provided from the outside host through the connector 2006. The electronic system 2000 may further include a power management integrated circuit (PMIC) for distributing the power source provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 14. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIG. 10.

In some example embodiments, the connection structure 2400 may be a bonding wire for electrically connecting the input/output pad 2210 and the package upper pads 2130. Thus, in each of the first and second semiconductor packages 2003a and 2003b, the semiconductor chips 2200 may be electrically connected with each other by a bonding wire method, and may be electrically connected to the package upper pads 2130 of the package substrate 2100. In some example embodiments, in each of the first and second semiconductor packages 2003a and 2003b, the semiconductor chips 2200 may be electrically connected with each other by a connection structure including a through silicon via (TSV), instead of the connection structure 2400 of the bonding wire method.

In some example embodiments, the controller 2002 and the semiconductor chips 2200 may be included in one package. In other example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 16:
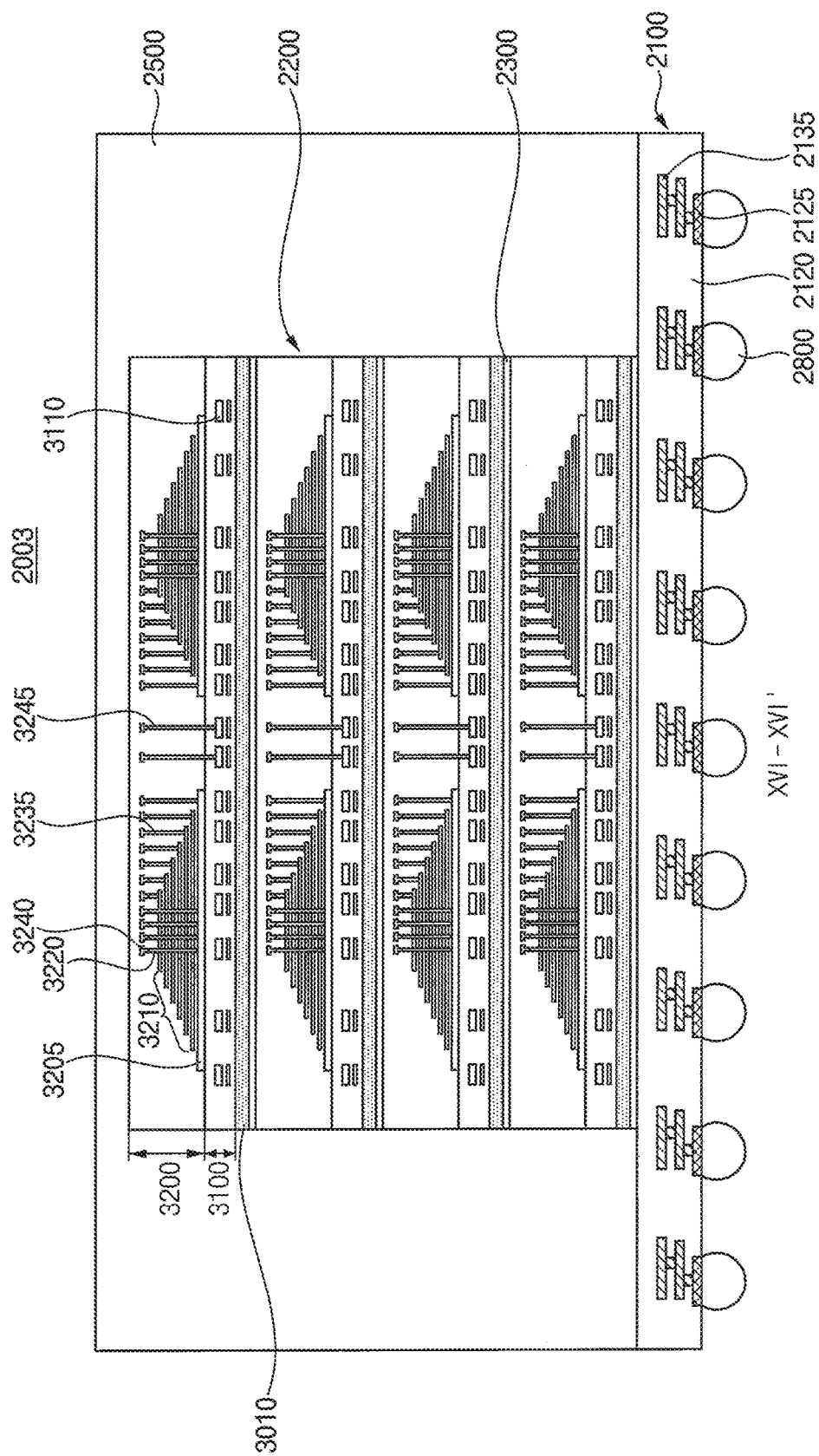
FIGS. 16 and 17 are schematic cross-sectional views illustrating semiconductor packages each of which may include a semiconductor device in accordance with an example embodiment.
Figure 17:
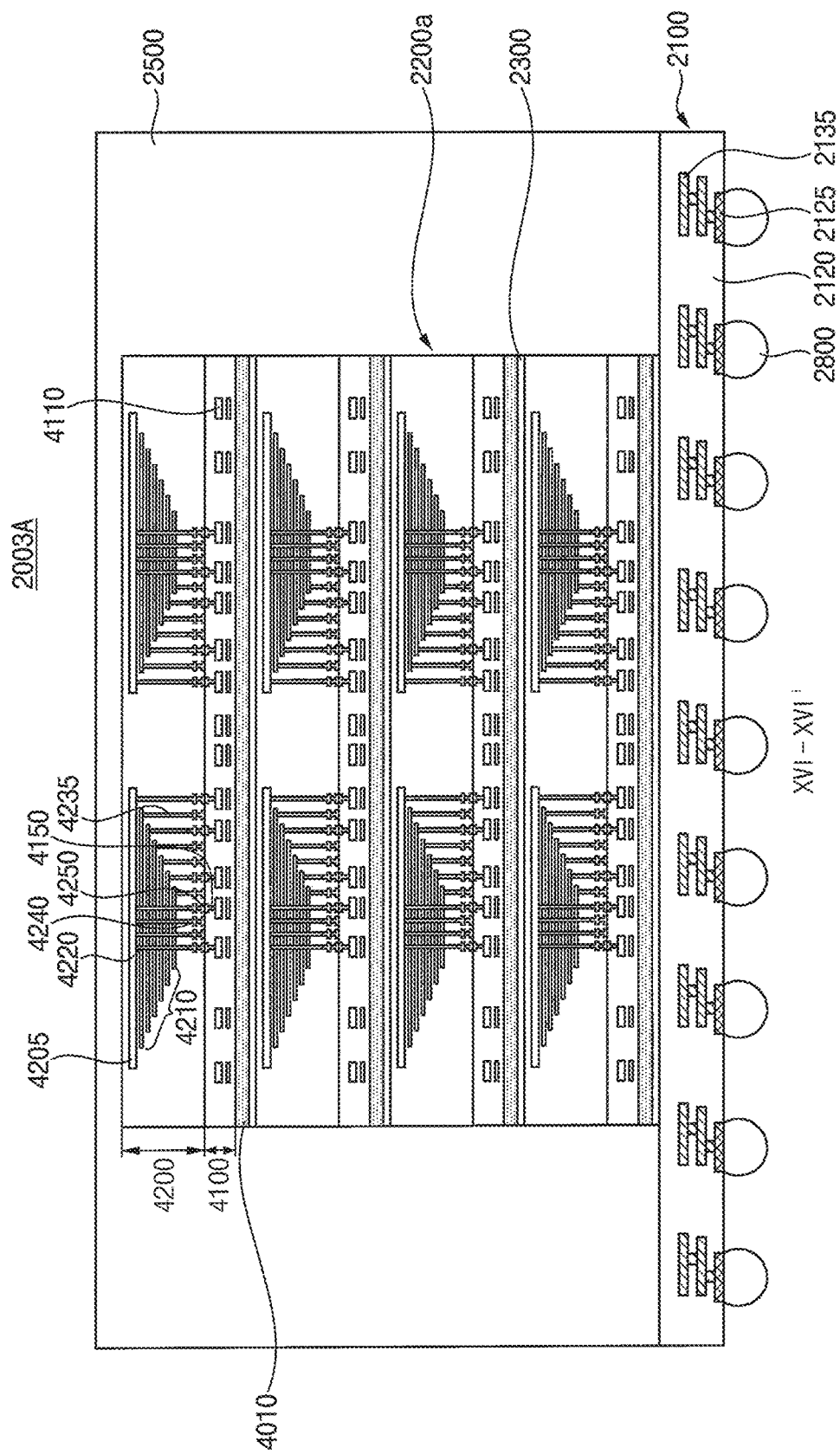

FIGS. 16 and 17 are schematic cross-sectional views illustrating semiconductor packages each of which may include a semiconductor device in accordance with an example embodiment. FIGS. 16 and 17 illustrate some example embodiments of the semiconductor package 2003 shown in FIG. 15, and show a cross-section taken along a line XVI-XVI' of the semiconductor package 2003 in FIG. 15.

Referring to FIG. 16, in the semiconductor package 2003, the package substrate 2100 may be a PCB. The package substrate 2100 may include a substrate body part 2120, the package upper pads 2130 (refer to FIG. 15) on an upper surface of the substrate body part 2120, package lower pads 2125 on a lower surface of the substrate body part 2120 or exposed through the lower surface of the substrate body part 2120, and inner wirings 2135 for electrically connecting the package upper pads 2130 and the package lower pads 2125 in an inside of the substrate body part 2120. The package upper pads 2130 may be electrically connected to the connection structures 2400. The package lower pads 2125 may be connected to wiring patterns 2005 of the main substrate 2010 in the electronic system 2000 through conductive connection parts 2800, as shown in FIG. 15.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 15) extending through the gate electrode structure 3210, bit lines 3240 electrically connected to the memory channel structures 3220, and gate connection wirings 3235 electrically connected to the word lines WL of the gate electrode structure 3210 (refer to FIG. 14).

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and some through wirings 3245 may extend through the gate electrode structure 3210. Each semiconductor chip 2200 may further include the input/output pad 2210 (refer to FIG. 15) electrically connected to the peripheral circuit wirings 3110 of the first structure 3100.

Referring to FIG. 17, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 15) extending through the gate electrode structure 4210, and second bonding structures 4250 electrically connected to the memory channel structures 4220 and the word lines WL (refer to FIG. 14) of the gate electrode structure 4210. For example, the second bonding structures 4250 may be electrically connected to the memory channel structures 4220 and the word lines WL (refer to FIG. 14) through the bit lines 4240 electrically connected to the memory channel structures 4220 and the gate connection wirings 4235 electrically connected to the word lines WL (refer to FIG. 14), respectively. The first bonding structures 4150 of the first structure 4100 and the second bonding structures 4250 of the second structure 4200 may contact each other to be bonded with each other. The first bonding structures 4150 and the second bonding structures 4250 may include, for example, copper.

Each semiconductor chip 2200a may further include the input/output pad 2210 (refer to FIG. 15) electrically connected to the peripheral circuit wirings 4110 of the first structure 4100.

The semiconductor chips 2200 of FIG. 16 and the semiconductor chips 2200a of FIG. 17 may be electrically connected with each other by the connection structures 2400 in a bonding wire method. However, in some example embodiments, semiconductor chips such as the semiconductor chips 2200 of FIG. 16 and the semiconductor chips 2200a of FIG. 10 in the same semiconductor package may be electrically connected with each other by a connection structure including a TSV.

While some example embodiments have been particularly shown and described, it will be understood by one of ordinary skill in the art that variations in form and detail may be made therein without departing from the spirit and scope of the claims.

What is claimed is:

1. A method of manufacturing a semiconductor device, the method comprising:
   alternately and repeatedly forming a first insulation layer and a first sacrificial layer on a substrate to form a mold layer;
   forming a sacrificial layer structure on the mold layer, the sacrificial layer structure including an etch stop layer and a second sacrificial layer sequentially stacked;
   forming a hard mask on the sacrificial layer structure;
   etching the sacrificial layer structure and the mold layer by a dry etching process using the hard mask as an etching mask to form a channel hole exposing an upper surface of the substrate, and form a recess on a sidewall of the second sacrificial layer, the sidewall of the second sacrificial layer being adjacent to the channel hole;
   providing layers over the recess in the channel hole to form a memory channel structure; and
   replacing the first sacrificial layer with a gate electrode.

2. The method of claim 1, wherein
   the dry etching process is performed using an etching gas including $CF_x$ gas, and
   an etch rate of the second sacrificial layer with respect to the etching gas is greater than etch rates of the etch stop layer, the first insulation layer and the first sacrificial layer with respect to the etching gas.

3. The method of claim 1, wherein
   the first insulation layer includes silicon oxide, and each of the first sacrificial layer and the etch stop layer includes silicon nitride, and
   the second sacrificial layer includes silicon nitride doped with one of hydrogen, boron, carbon, phosphorus or arsenic.

4. The method of claim 1, wherein
   the first insulation layer includes silicon oxide, and each of the first sacrificial layer and the etch stop layer includes silicon nitride, and
   the second sacrificial layer has a chemical formula of $SiA_{1-x}B_x$, where A and B includes one of boron, carbon, nitride, oxygen or phosphorus, and A and B are different from each other.

5. The method of claim 4, wherein
   a concentration of the A or B included in the second sacrificial layer gradually increases or decreases in a vertical direction substantially perpendicular to the upper surface of the substrate.

6. The method of claim 1, wherein the forming a sacrificial layer structure includes:
   forming the etch stop layer on the mold layer; and
   forming the second sacrificial layer by doping one of hydrogen, boron, carbon, phosphorus or arsenic into the etch stop layer.

7. The method of claim 1, wherein the forming a sacrificial layer structure further includes:
   forming a second insulation layer on the second sacrificial layer; and
   forming a third sacrificial layer on the second insulation layer.

8. The method of claim 7, wherein
   the second insulation layer includes silicon oxide, and
   the third sacrificial layer includes silicon oxide doped with one of hydrogen, boron, carbon, phosphorus or arsenic.

9. The method of claim 7, wherein
   the second insulation layer includes silicon oxide, and
   the third sacrificial layer has a chemical formula of $SiA_{1-x}B_x$, where A and B includes one of boron, carbon, nitride, oxygen or phosphorus, and A and B are different from each other.

10. The method of claim 1, wherein the forming a sacrificial layer structure further includes forming a third sacrificial layer on the mold layer.

11. The method of claim 10, wherein
    the first insulation layer is formed at an uppermost level of the mold layer, and the first insulation layer includes silicon oxide, and
    the third sacrificial layer includes silicon oxide doped with one of hydrogen, boron, carbon, phosphorus or arsenic.

12. The method of claim 10, wherein the third sacrificial layer has a chemical formula of $SiA_{1-x}B_x$, where A and B includes one of boron, carbon, nitride, oxygen or phosphorus, and A and B are different from each other.

13. The method of claim 1, wherein the sacrificial layer structure includes a plurality of etch stop layers and a plurality of second sacrificial layers alternately and repeatedly stacked in a vertical direction substantially perpendicular to the upper surface of the substrate, the plurality of etch stop layers including the etch stop layer, and the plurality of second sacrificial layers including the second sacrificial layer.

14. The method of claim 1, wherein the providing layers over the recess in the channel hole to form a memory channel structure includes:
    forming a charge storage layer structure along a lateral boundary of the channel hole and the exposed upper surface of the substrate;
    forming a channel layer on the charge storage layer structure;
    forming a filling layer on the channel layer to fill a remaining portion of the channel hole; and
    planarizing the filling layer, the channel layer and the charge storage layer structure until an upper surface of the mold layer is exposed.

15. A method of manufacturing a semiconductor device, the method comprising:
    alternately and repeatedly forming a first insulation layer and a first sacrificial layer on a substrate to form a mold layer;

forming a sacrificial layer structure on the mold layer, the sacrificial layer structure including a second sacrificial layer, an etch stop layer, a third sacrificial layer, a second insulation layer and a fourth sacrificial layer sequentially stacked;

forming a hard mask on the sacrificial layer structure;

etching the sacrificial layer structure and the mold layer by a dry etching process using the hard mask as an etching mask to form a channel hole exposing an upper surface of the substrate, and to form recesses on sidewalls of the second to fourth sacrificial layers;

providing layers over the recesses in the channel hole to form a memory channel structure; and replacing the first sacrificial layer with a gate electrode.

16. The method of claim 15, wherein:

each of the first and second insulation layers includes silicon oxide, and the etch stop layer includes silicon nitride, each of the second and fourth sacrificial layer includes silicon oxide doped with one of hydrogen, boron, carbon, phosphorus or arsenic, and the third sacrificial layer includes silicon nitride doped with one of hydrogen, boron, carbon, phosphorus or arsenic.

17. The method of claim 15, wherein each of the second to fourth sacrificial layers has a chemical formula of $SiA_{1-x}B_x$, wherein A and B includes one of boron, carbon, nitride, oxygen or phosphorus, and A and B are different from each other.

18. The method of claim 17, wherein a concentration of the A or B included in each of the second to fourth sacrificial layers gradually increases or decreases in a vertical direction substantially perpendicular to the upper surface of the substrate.

19. A method of manufacturing a semiconductor device, the method comprising:

alternately and repeatedly forming a first insulation layer and a first sacrificial layer on a substrate to form a mold layer;

forming a sacrificial layer structure on the mold layer, the sacrificial layer structure including an etch stop layer, a second sacrificial layer, and a second insulation layer sequentially stacked;

forming a hard mask on the sacrificial layer structure;

etching the sacrificial layer structure and the mold layer by a dry etching process using the hard mask as an etching mask to form a channel hole exposing an upper surface of the substrate and a recess on a sidewall of the sacrificial layer;

providing layers over the recess in the channel hole to form a memory channel structure; and replacing the first sacrificial layer with a gate electrode, wherein an etch rate of the second sacrificial layer with respect to an etching gas in the dry etching process is greater than etch rates of the etch stop layer and the second insulation layer with respect to the etching gas such that a recess is formed on a sidewall of the second sacrificial layer adjacent to the channel hole during the dry etching process.

20. The method of claim 19, wherein the sacrificial layer structure further includes a third sacrificial layer between the mold layer and the etch stop layer or on the second insulation layer, and an etch rate of the third sacrificial layer with respect to the etching gas in the dry etching process is greater than etch rates of the etch stop layer and the second insulation layer with respect to the etching gas such that the recess is formed on a sidewall of the third sacrificial layer adjacent to the channel hole during the dry etching process.

* * * * *